(12) United States Patent
Lake

(10) Patent No.: US 7,199,449 B2
(45) Date of Patent: Apr. 3, 2007

(54) WAFER BACKSIDE REMOVAL TO COMPLETE THROUGH-HOLES AND PROVIDE WAFER SINGULATION DURING THE FORMATION OF A SEMICONDUCTOR DEVICE

(75) Inventor: Rickie C. Lake, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 224 days.

(21) Appl. No.: 10/925,525

(22) Filed: Aug. 24, 2004

(65) Prior Publication Data

US 2006/0043533 A1  Mar. 2, 2006

(51) Int. Cl.
*H01L 21/78* (2006.01)

(52) U.S. Cl. ............... 257/618; 438/462; 257/E21.484; 257/E21.705

(58) Field of Classification Search ................ 257/618; 438/462, 113
See application file for complete search history.

(56) References Cited

U.S. PATENT DOCUMENTS

| | | | |
|---|---|---|---|
| 5,185,292 A | 2/1993 | VanVonno et al. .......... | 437/180 |
| 5,824,595 A | 10/1998 | Igel et al. .................... | 438/464 |
| 6,107,164 A | 8/2000 | Ohuchi ....................... | 438/465 |
| 6,391,685 B1 * | 5/2002 | Hikita et al. ................ | 438/113 |
| 6,528,393 B2 | 3/2003 | Tao ............................. | 438/460 |
| 2003/0232488 A1 * | 12/2003 | Chua et al. .................. | 438/460 |

OTHER PUBLICATIONS

"Toshiba Develops Paper-Thin Package", Yoshihiko Hara, EE Times, Jun. 2, 1999.

* cited by examiner

*Primary Examiner*—W. David Coleman
(74) *Attorney, Agent, or Firm*—Kevin D. Martin

(57) ABSTRACT

A method used to form a semiconductor device comprises processing a semiconductor wafer to include one or more vias or through-holes only partially etched into the wafer, and scribe marks only partially etched into the wafer which define a plurality of semiconductor devices. Wafer material is removed from the back of the wafer to the level of the vias and scribe marks to form a via opening through the wafer while simultaneously dicing the wafer into individual semiconductor dice.

16 Claims, 5 Drawing Sheets

WAFER BACKSIDE REMOVAL TO COMPLETE THROUGH-HOLES AND PROVIDE WAFER SINGULATION DURING THE FORMATION OF A SEMICONDUCTOR DEVICE

FIELD OF THE INVENTION

This invention relates to the field of semiconductor manufacture and, more particularly, to a method which provides one or more vias through a silicon substrate, and also provides dicing of a wafer simultaneously with via formation.

BACKGROUND OF THE INVENTION

To form individual semiconductor devices from a semiconductor wafer, various features such as transistors, storage capacitors, and other electronic circuitry are formed on the front of the semiconductor wafer, then the wafer is diced or singulated (singularized) to form a plurality of individual semiconductor dice.

One method to dice a semiconductor wafer is to attach a plasticized adhesive tape or film to a frame, adhere the semiconductor wafer to the adhesive film, and then cut through the wafer from the circuit (front) side with a wafer or dicing saw at a wafer scribe (kerf or "street") area and partially into the adhesive film to ensure complete singulation of each semiconductor die. Each die which has been determined to be functional from a prior probe test is then removed from the adhesive film for packaging.

Semiconductor devices having small outlines and thin profiles are desirable to minimize the size of electronic devices such as notebook computers, cell phones, and generally any device into which they are installed. However, processing semiconductor devices on a very thin semiconductor wafer is difficult because an already fragile semiconductor wafer becomes even more susceptible to breakage as it becomes thinner.

Methods of wafer singulation which aid in the formation of very thin semiconductor devices have been proposed. In one method, electronic circuitry is formed on a relatively thick semiconductor wafer, then grooves are only partially cut into the front of the semiconductor wafer at the scribe areas. Subsequently, the wafer is etched or ground from the back of the wafer to the level of the cuts. Back grinding the wafer first thins it to a desired profile, then dices the wafer once the level of the cuts is reached.

To minimize the outline of a semiconductor device, attempts have been made to stack a plurality of semiconductor dice. While this increases the thickness of a completed device, it is sometimes preferable to have a thicker package than to increase the overall outline or "footprint" of the device. Stacking semiconductor device requires electrical interconnections from one device to another, which is often performed through an interconnection running along the outside of the dice, or through vias which have been etched from the front through the dice prior to their singulation from the wafer. Vias through the wafer are formed by mechanically or chemically etching completely through the wafer from the front. A conductor, typically metal, is then formed within the opening through the wafer usually by chemical vapor deposition (CVD) or by reflow of a metal.

A method which allows for improved processing of a semiconductor device would be desirable.

SUMMARY OF THE INVENTION

The present invention provides a new method which, among other advantages, decreases the number of processing steps required to form a via and to singularize a semiconductor wafer. In accordance with one embodiment of the invention a semiconductor wafer is processed to include a plurality of vias or through-holes partially etched into the wafer, as well as grooves partially etched into the wafer. The grooves are formed in the scribe area of the wafer to define a plurality of individual dice but to leave the wafer intact. The partially etched vias and grooves can be formed into the wafer at the same depth, preferably using a single mask. Finally, the wafer is etched from the back or back ground to the level of the vias and scribes. This results in the simultaneous completion of the vias through the wafer and the singulation of the wafer into a plurality of individual semiconductor dice.

Additional advantages will become apparent to those skilled in the art from the following detailed description read in conjunction with the appended claims and the drawings attached hereto.

It should be emphasized that the drawings herein may not be to exact scale unless specified as such and are schematic representations. Except where specified, the drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been used to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 1:
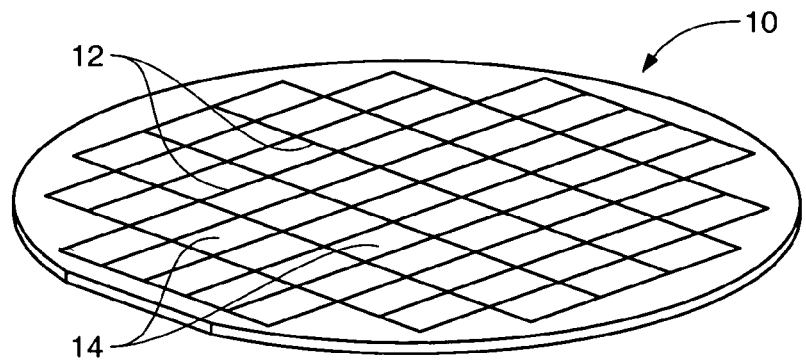
FIG. 1 is an isometric view depicting a semiconductor wafer having partially etched grooves in accordance with a first embodiment of the invention.
Figure 2:
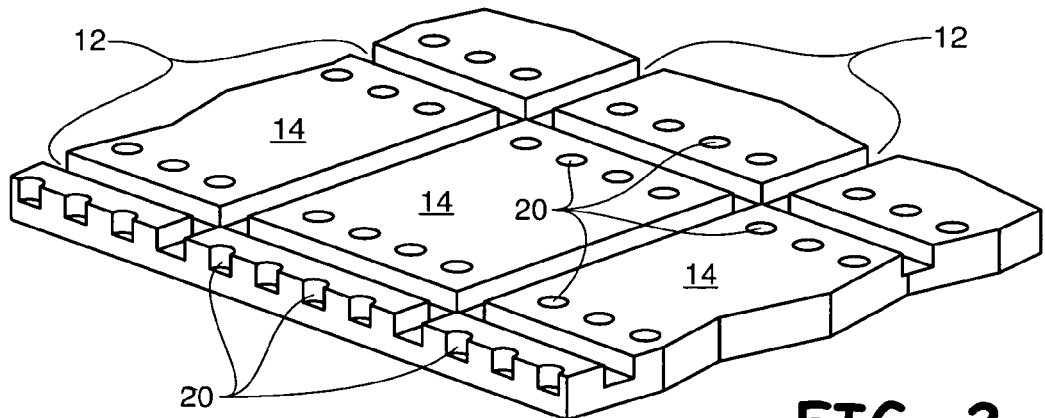
FIG. 2 is an enlarged view of the FIG. 1 embodiment depicting partially etched grooves and partially etched through-holes formed in the semiconductor wafer.
Figure 3:
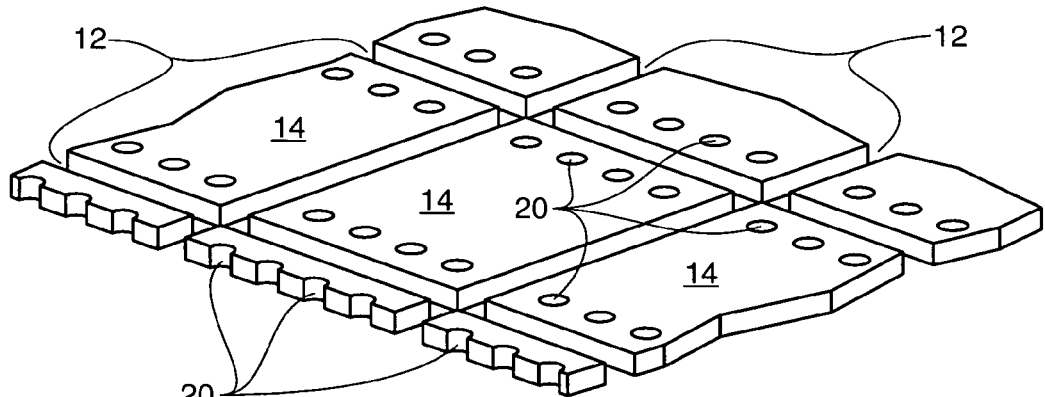
FIG. 3 depicts the FIG. 2 structure subsequent to backside etching to form singularized semiconductor dice.
Figure 4:
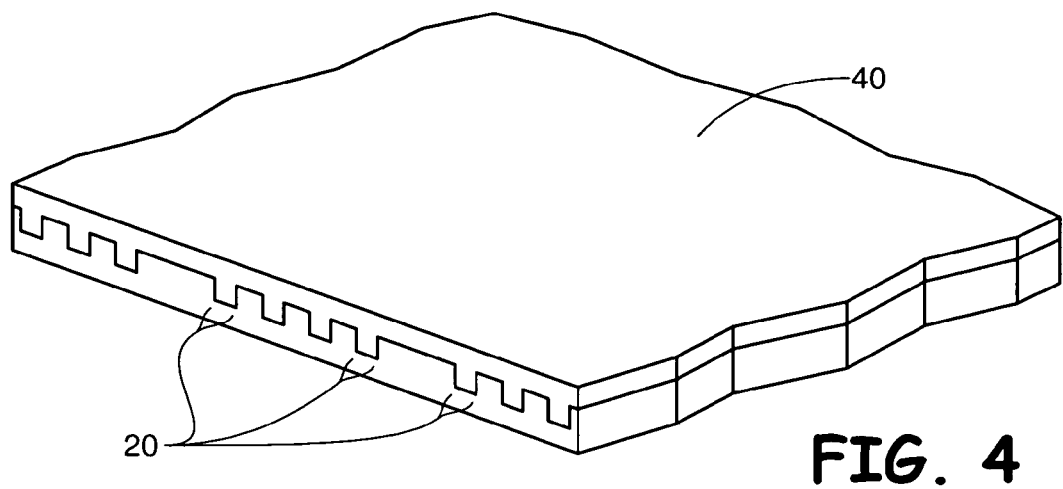
FIG. 4 depicts a portion of a semiconductor wafer having partially etched through-holes filled with a blanket conductor.

A first embodiment of an inventive process to form a semiconductor device is depicted in FIGS. 1–3. FIG. 1 depicts an in-process semiconductor wafer substrate assembly 10 comprising circuitry formed thereon (not depicted) using means known in the art. FIG. 1 further depicts a plurality of grooves 12 which define, but do not singularize, a plurality of individual semiconductor dice 14. In this embodiment, the wafer is between about 500 micrometers (µm) and about 750 µm thick, typically about 725 µm thick, and the grooves are formed to be between about 125 µm and about 175 µm deep (preferably about 150 µm deep) and between about 10 µm and about 100 µm wide (preferably about 50 µm wide). The grooves may be formed using a wafer saw, or may be more preferably formed using an etch which simultaneously defines a plurality of vias or through-holes on the wafer. FIG. 2, which depicts a magnified view of a small portion of the FIG. 1 structure, depicts a portion of the grooves 12 and dice 14 of FIG. 1, and further depicts a plurality of partially etched vias or through-holes 20. The vias are depicted out of scale with the grooves for illustration purposes and will typically be between about 25 µm and about 75 µm in diameter, typically about 50 µm. The location of the through-holes on each die, as well as the number of vias on each die, will depend on their eventual use. In this embodiment the through-holes, when filled with metal or other conductor, will provide an interconnection between the circuit side and the noncircuit side of the semiconductor die. An exemplary use for this includes a means for grounding a feature on the circuit side of the die to a lead frame paddle through a conductor in the via, or for stacking of interconnected die in high-density applications.

Subsequent to forming the vias and grooves as depicted in FIG. 2, the back (noncircuit) side of the wafer is etched or mechanically ground to thin the wafer to the level of the bottom of the vias and grooves. This singularizes the wafer into individual separate dice and completes the through-hole in each die. In this embodiment, between about 500 µm and about 650 µm of material is removed, depending on the original thickness of the wafer and the depth of the vias and grooves.

The wafer can be mechanically ground using a Strausbaugh polisher or chemically etched using a plasma, for example one comprising $CF_4$. A preferred chemical etch comprises the use of SpinEtch® BT from General Chemical Co., which is a mixture of sulfuric acid ($H_2SO_4$), nitric acid ($HNO_3$), hydrofluoric acid (HF), and phosphoric acid ($H_3PO_4$). SpinEtch® BT will remove about 0.5 µm of silicon each second. During removal of material from the back of the wafer, it can be held in place using a Bernoulli chuck on an SEZ SpinEtch® tool. Regardless of the method of thinning the wafer from the back, the wafer is singularized into individual dice while the vias or through-holes are completed to result in the individual semiconductor dice of FIG. 3.

After dicing the wafer to result in the plurality of individual dice of FIG. 3 a metal layer is formed within the vias. This can be accomplished by various means. For example, the via may be filled by placing a solid metal ball over each via, then reflowing the metal. The metal is drawn into the via by capillarity. Further, chemical vapor deposition (CVD) may be used to fill the vias, or a damascene process may be used. Regardless of the method of via filling, any required wafer processing necessary then continues along with subsequent packaging of the die.

Another embodiment of the invention is depicted by FIGS. 4–7. In this embodiment, vias 20 are partially etched into the wafer then filled with a conductor 40 such as metal prior to forming the grooves in the wafer. The type of conductor depends on the use of the conductor-filled vias, but may comprise tungsten, copper, silver-filled epoxy, etc. The conductive layer 40 may be formed using chemical vapor deposition (CVD), sputtering, reflow, or other workable processes.

Figure 5:
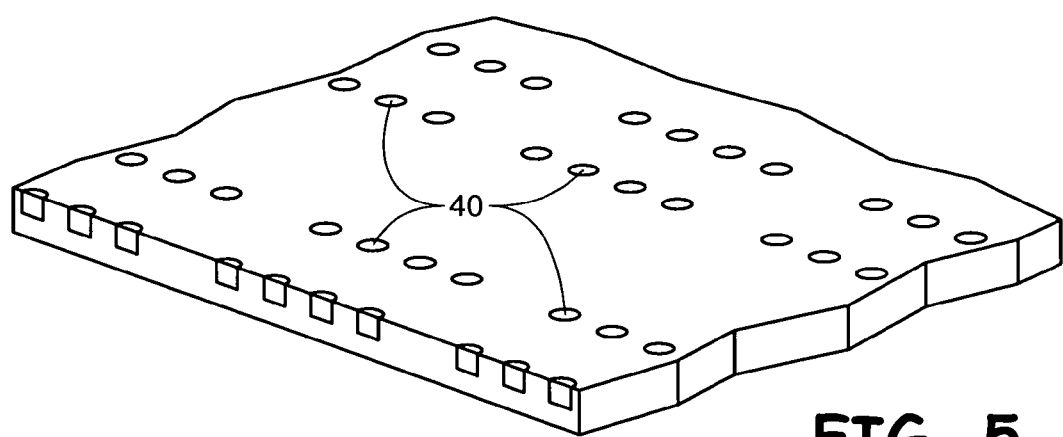
FIG. 5 depicts the FIG. 2 structure after removal of the conductor from over the wafer except that the conductor remains within the partially etched through-holes.
Figure 6:
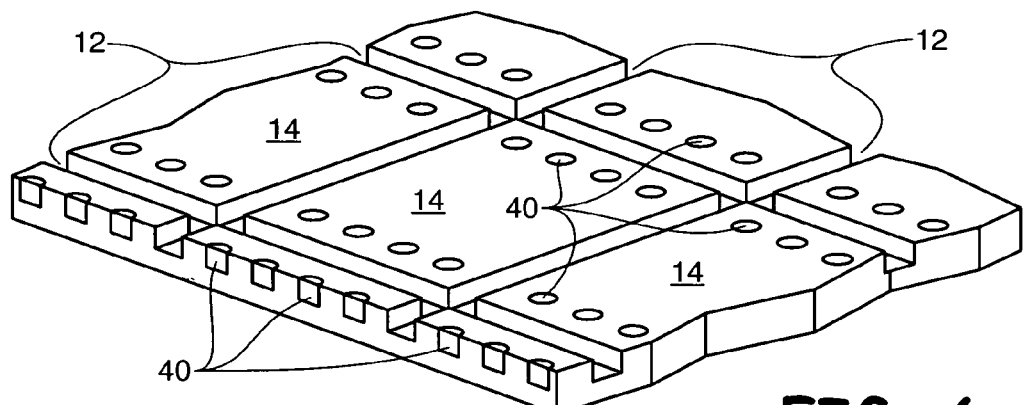
FIG. 6 depicts the FIG. 5 structure after scribing the wafer to define a plurality of individual semiconductor dice.
Figure 7:
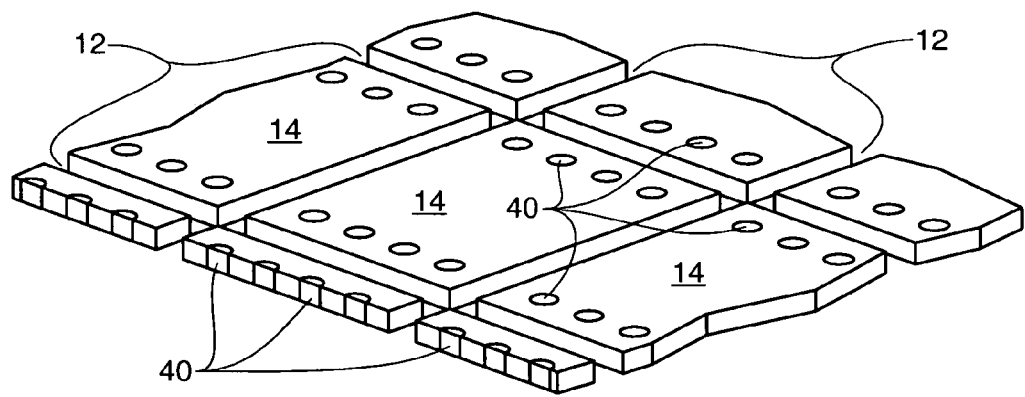
FIG. 7 depicts the FIG. 6 structure subsequent to removal of material from the back of the wafer which exposes the conductor within the through-holes on the back side of the wafer and also dices the wafer to form a plurality of singularized semiconductor dice.

After forming conductive layer 40 it is removed from over the wafer except from within the vias, for example using chemical mechanical planarization (CMP) or an etch to result in the structure of FIG. 5 having conductor within the vias. Subsequently, grooves 12 which define a plurality of individual dice 14, but do not singularize the wafer, are formed in the wafer as depicted in FIG. 6. As with the first embodiment, the grooves can be formed by etching or using a dicing saw. Subsequently, material is removed from the back of the wafer in a manner similar to the first embodiment to result in the singularized dice of FIG. 7. The removal of material from the back of the wafer exposes the conductor 40 on the back side of the wafer and completes grooves 12 to singularize the wafer into individual semiconductor dice 14. Wafer processing then continues, for example attachment to a lead frame and encapsulation, to further testing for use as a known good die, etc.

In another embodiment, the vias and grooves can be formed partially into the wafer as depicted in FIG. 2, then the partially formed grooves and vias can be filled with a blanket conductor using a method described for one of the previous embodiments. The metal is removed from the planar surface of the circuit side of the wafer, for example by etching, grinding, or using mechanical polishing or chemical mechanical polishing (CMP). Subsequent to removing the metal from the planar circuit side, the vias are masked off and the metal is etched from the partially formed grooves. After etching the metal from the grooves, the mask is removed and the wafer is back ground according to the previous embodiments to expose the vias from the back of the wafer and to singularize the plurality of dice.

The etchant used to etch the metal in the previous embodiment (or other embodiments described herein) depends on the metal. For example, to etch copper, ferric chloride ($FeCl_3$) available from Transcene® Co. of Danvers, Mass. under material no. CE-100 will etch copper at a rate of about 25 µm per minute. For nickel, Type 1 nickel etchant, also available from Transcene® Co., will etch nickel at a rate of about 75 µm per hour.

In another embodiment, the vias and grooves can be formed partially into the wafer as depicted in FIG. 2, then the partially formed grooves and vias can be filled with a blanket conductor using a method described for one of the previous embodiments. The metal is removed from the planar surface of the circuit side of the wafer, for example by etching, grinding, or using mechanical polishing or chemical mechanical polishing (CMP). Subsequent to removing the metal from the planar circuit side, the wafer is back ground to expose the metal in the vias and in the grooves from the back side of the wafer. At this point, the dice of the wafer are held together by the metal formed within the grooves. The vias are masked off from either the front or back side of the wafer, then the metal is etched from the partially formed grooves from whichever side is masked off to result in singularized semiconductor dice. Wafer processing then continues.

Figure 8:
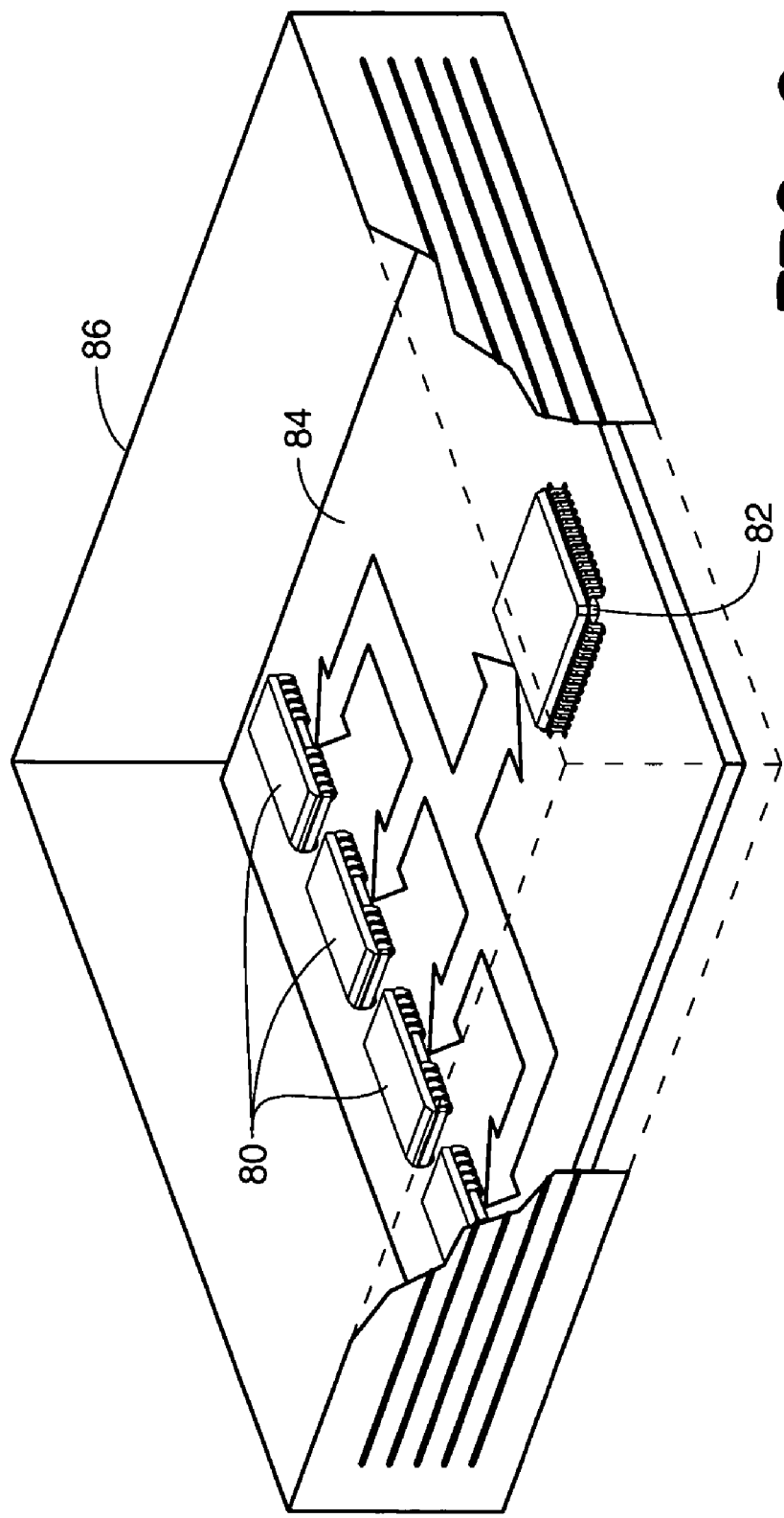
FIG. 8 is an isometric depiction of various components which may be manufactured using devices formed with an embodiment of the present invention.

As depicted in FIG. 8, a semiconductor device 80 formed in accordance with the invention may be attached along with other devices such as a microprocessor 82 to a printed circuit board 84, for example to a computer motherboard or as a part of a memory module used in a personal computer, a minicomputer, or a mainframe 86. FIG. 8 may also represent use of device 80 in other electronic devices comprising a housing 86, for example devices comprising a microprocessor 82, related to telecommunications, the automobile industry, semiconductor test and manufacturing equipment, consumer electronics, or virtually any piece of consumer or industrial electronic equipment.

Figure 9:
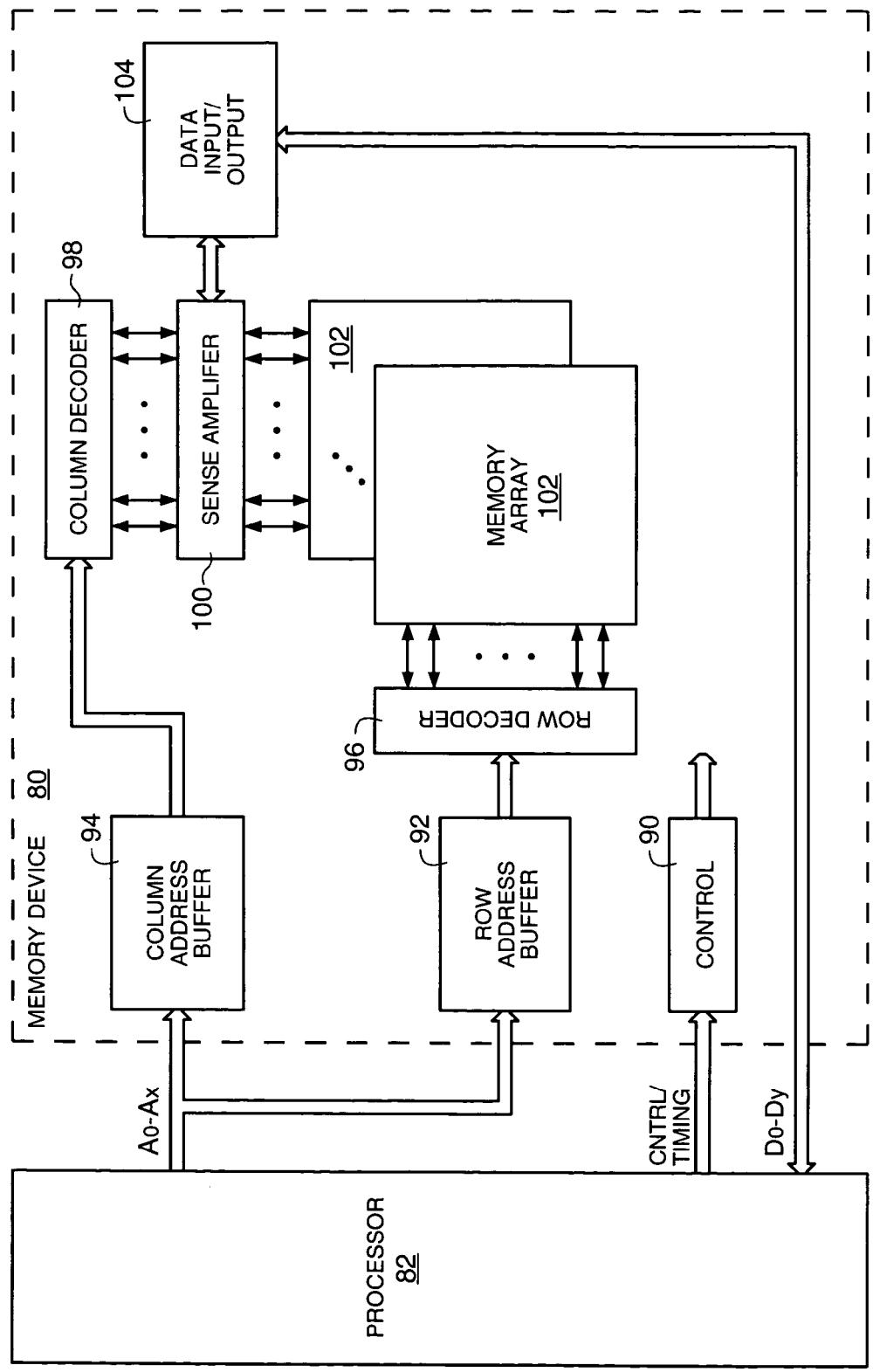
FIG. 9 is a block diagram of an exemplary use of the invention to form part of a memory device having a storage transistor array.

The process and structure described herein can be used to manufacture a number of different semiconductor devices which comprise a feature formed using a photolithographic process. FIG. 9, for example, is a simplified block diagram of a memory device such as a dynamic random access memory having digit lines and other features which may be formed on a device which comprises the invention. The general operation of such a device is known to one skilled in the art. FIG. 9 depicts a processor 82 coupled to a memory device 80, and further depicts the following basic sections of a memory integrated circuit: control circuitry 90; row 92 and column 94 address buffers; row 96 and column 98 decoders; sense amplifiers 100; memory array 102; and data input/output 104.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used to manufacture a semiconductor device comprising:
    removing material from a circuit side of a semiconductor wafer to form a plurality of grooves only partially into the wafer, wherein each groove comprises a bottom formed from the wafer;
    removing material from the circuit side of the wafer to form a plurality of through-holes only partially into the wafer, wherein each through-hole comprises a bottom formed from the wafer;
    removing material from a noncircuit side of the semiconductor wafer to simultaneously remove the bottoms of both the partially formed grooves and the partially formed through-holes, such that removing the bottoms of the grooves dices the wafer and removing the bottoms of the through-holes forms a plurality of openings which extend through the wafer from the circuit side of the wafer to the noncircuit side of the wafer.

2. The method of claim 1 further comprising forming a conductor within each through-hole prior to removing the bottom of the through-holes.

3. The method of claim 1 further comprising:
    etching the material from the circuit side of the wafer to form the plurality of through-holes prior to forming the grooves; and
    removing the bottom of the partially formed grooves and the partially formed through-holes during a single removal process.

4. The method of claim 1 further comprising:
    etching the circuit side of the wafer to form the plurality of through-holes only partially into the wafer; and
    sawing the circuit side of the wafer with a dicing saw to form the plurality of grooves only partially into the wafer.

5. The method of claim 4 further comprising back grinding the wafer to remove the material from the noncircuit side of the wafer to remove the bottom of the partially formed grooves and the partially formed through-holes.

6. The method of claim 4 further comprising etching the wafer to remove the material from the noncircuit side of the wafer to remove the bottom of the partially formed grooves and the partially formed through-holes.

7. A method used to manufacture a semiconductor device comprising:
    forming a semiconductor wafer substrate assembly comprising a semiconductor wafer having a circuit side and a back side opposite the circuit side;
    etching the circuit side of the wafer to simultaneously form a plurality of openings formed only part way into the wafer and a plurality of grooves only part way into the wafer, wherein the grooves define the perimeters of a plurality of semiconductor dice;
    forming a blanket conductive layer over the circuit side of the wafer to fill the plurality of openings and plurality of grooves formed only part way into the wafer;
    removing the conductive layer from over the circuit side of the wafer and leaving the conductive layer within the plurality of openings and plurality of grooves formed only part way into the wafer;
    subsequent to removing the conductive layer, forming a mask on the circuit side of the wafer over the conductor-filled openings and leaving the conductive layer within the plurality of grooves exposed; etching the conductive layer from the plurality of grooves formed only part way into the wafer;
    subsequent to etching the conductive layer from the plurality of grooves formed only part way into the wafer, removing material from the back side of the wafer to simultaneously form conductor-filled vias in the wafer which extend from the circuit side of the wafer to the back side of the wafer and which singularizes the wafer into a plurality of individual semiconductor dice.

8. A method used during the formation of a semiconductor device, comprising:
    forming a semiconductor wafer substrate assembly comprising a semiconductor wafer having a circuit side with circuitry thereon and a back side;
    etching a plurality of openings only part way through the circuit side of the semiconductor wafer;

forming a plurality of conductive plugs with one plug within each of the plurality of partially etched openings;

subsequent to forming the plurality of conductive plugs, forming a plurality of grooves only part way through the circuit side of the semiconductor wafer to define a plurality of semiconductor dice; and removing material from the back side of the semiconductor wafer to expose the plugs from the back side of the semiconductor wafer and to singularize the plurality of dice defined by the plurality of grooves.

9. The method of claim 8 further comprising forming the plurality of grooves only part way through the circuit side of the semiconductor wafer in a kerf area of the wafer using a dicing saw.

10. The method of claim 8 further comprising etching the plurality of grooves only part way thorough the circuit side of the semiconductor wafer in a kerf area of the wafer using an etching process.

11. The method of claim 8 further comprising:
forming a blanket conductive layer within the partially etched openings and over the circuit side of the semiconductor wafer; and planarizing the blanket conductive layer to remove the blanket conductive layer from over the circuit side of the wafer and leaving the plugs formed within the partially etched openings.

12. A method used to manufacture a semiconductor device comprising:
forming a semiconductor wafer substrate assembly comprising a semiconductor wafer having a circuit side and a back side opposite the circuit side;

etching the circuit side of the wafer to simultaneously form a plurality of openings formed only part way into the wafer and a plurality of grooves only part way into the wafer, wherein the grooves define the perimeters of a plurality of semiconductor dice;

forming a blanket conductive layer over the circuit side of the wafer to fill the plurality of openings and plurality of grooves formed only part way into the wafer;

removing the conductive layer from over the circuit side of the wafer and leaving the conductive layer within the plurality of openings and plurality of grooves formed only part way into the wafer;

subsequent to removing the conductive layer from over the circuit side of the wafer, removing material from the back side of the wafer to simultaneously form conductor-filled vias in the wafer which extend from the circuit side of the wafer to the back side of the wafer and conductive lines which hold each of the plurality of dice defined by the plurality of grooves together;

subsequent to removing material from the back side of the wafer, forming a mask on the wafer over the conductor-filled vias and leaving the conductive layer within the plurality of grooves exposed; and etching the conductive layer from the plurality of grooves formed only part way into the wafer to singularize the wafer into a plurality of individual semiconductor dice.

13. An in-process semiconductor wafer substrate assembly comprising:
a semiconductor wafer substrate assembly comprising a semiconductor wafer having a circuit side with circuitry thereon and a back side opposite the circuit side;

the semiconductor wafer having a plurality of openings therein only part way through a thickness of the semiconductor wafer;

the semiconductor wafer having a plurality of grooves therein only part way through the thickness of the semiconductor wafer at a depth about equal to a depth of the plurality of openings, wherein the grooves are formed in a kerf area of the wafer and define a plurality of semiconductor dice formed from the wafer.

14. The in-process semiconductor wafer substrate assembly of claim 13 further comprising a conductive layer comprising a plurality of electrically isolated conductive plugs within the openings.

15. The in-process semiconductor wafer substrate assembly of claim 13 wherein the plurality of grooves are continuous around a perimeter of each die of the plurality of semiconductor dice.

16. The in-process semiconductor wafer substrate assembly of claim 14 wherein the conductive layer further comprises a portion within the grooves in the kerf area of the semiconductor wafer which define the plurality of semiconductor dice.

* * * * *